United States Patent [19]

Halbeck

[11] 4,109,126

[45] Aug. 22, 1978

[54] CONDUCTIVE COATING ON SWITCH LEVER SEAL FOR RFI ELIMINATION

[75] Inventor: Werner B. Halbeck, Mequon, Wis.

[73] Assignee: Cutler-Hammer, Inc., Milwaukee, Wis.

[21] Appl. No.: 736,391

[22] Filed: Oct. 28, 1976

[51] Int. Cl.² .................... H01H 9/04; H01H 9/12
[52] U.S. Cl. ................................... 200/302; 200/305
[58] Field of Search ............................ 200/302, 305

[56] References Cited

U.S. PATENT DOCUMENTS

| 2,323,399 | 7/1943 | Jacobi | 200/305 X |
| 3,317,698 | 5/1967 | Mansfield | 200/305 X |
| 3,487,186 | 12/1969 | Johnson et al. | 200/305 |
| 3,566,064 | 2/1971 | Neillis | 200/305 |
| 3,959,617 | 5/1976 | Hults | 200/305 |
| 3,973,099 | 8/1976 | Morris, Sr. | 200/302 X |

FOREIGN PATENT DOCUMENTS 1,288,287  2/1962  France .................................. 200/302

Primary Examiner—Stephen Marcus
Attorney, Agent, or Firm—Hugh R. Rather; William A. Autio; Michael E. Taken

[57] ABSTRACT

RFI (radio frequency interference) is eliminated by the placing of a conductive elastomer coating over the toggle lever seal so as to electrically connect the toggle lever to the switch metal frame or housing that is grounded through the mounting panel.

7 Claims, 3 Drawing Figures

CONDUCTIVE COATING ON SWITCH LEVER SEAL FOR RFI ELIMINATION

BACKGROUND OF THE INVENTION

Sealed toggle lever switches with RFI elimination have been known heretofore. For example, H. W. Hults U.S. Pat. No. 3,959,617, dated May 25, 1976, and assigned to the assignee of this invention, shows a sealed toggle lever switch having conductive lubricant such as grease between the metal toggle lever and its pivot pin to insure good electrical connection of the toggle lever to ground through the switch housing. And H. W. Hults copending application Ser. No. 664,309 now abandoned, filed Mar. 5, 1976, which is a continuation of Ser. No. 541,095, filed Jan. 15, 1975, now abandoned, shows a sealed toggle lever switch that uses conductive elastomer for the seal to keep the metal toggle lever of the switch electrically connected to the switch housing that is grounded.

While these prior RFI suppression techniques have been useful for their intended purposes, this invention relates to an alternative RFI elimination structure that has certain manufacturing and functional advantages over prior art devices.

SUMMARY OF THE INVENTION

This invention relates to electric switches and more particularly to simple and effective means for eliminating the RFI problem in connection therewith.

An object of the invention is to provide an improved electric switch.

A more specific object of the invention is to provide an improved and simplified means to eliminate RFI.

Another specific object of the invention is to provide a toggle switch with improved means for eliminating RFI by grounding the metal toggle lever with a conductive elastomer coating applied to the lever seal.

Other objects and advantages of the invention will hereinafter appear.

DESCRIPTION OF THE PREFERRED EMBODIMENT

Figure 1:
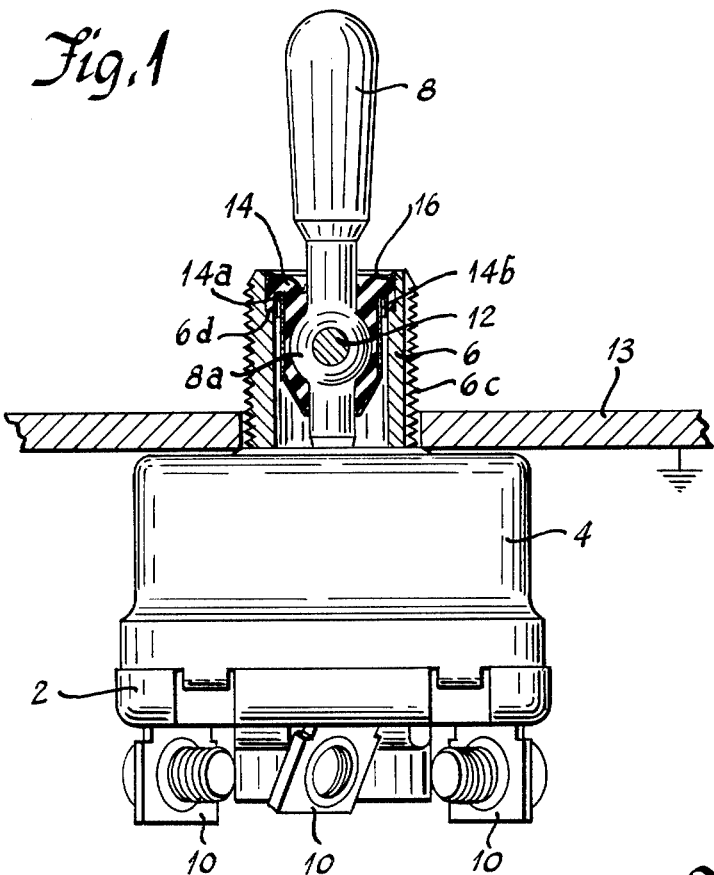
FIG. 1 is an enlarged front elevational view, partly in section, of a toggle switch in a hole in a mounting panel showing its lever seal and conductive coating thereon as viewed in a plane transverse to the axis of its pivot pin.
Figure 2:
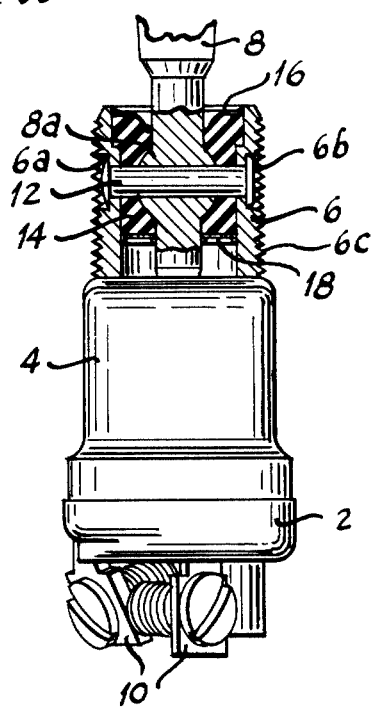
FIG. 2 is an end elevational view, partly in section, of the toggle switch of FIG. 1 showing its lever seal and conductive coating thereon as viewed on the axis of its pivot pin.
Figure 3:
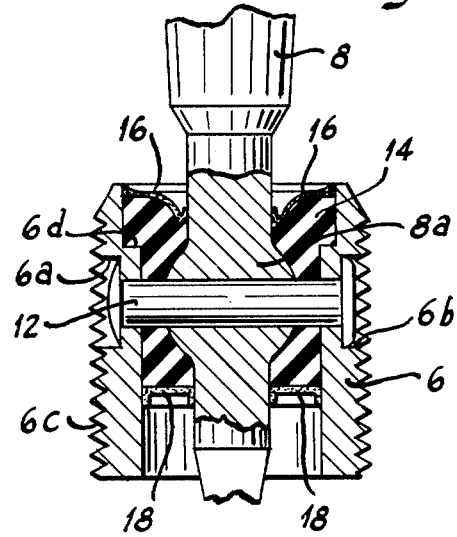
FIG. 3 is a further enlarged view of the upper portion of FIG. 2 more clearly showing the conductive elastomer coating on the upper and lower surfaces of the lever seal between the toggle lever and the inner wall of the bushing.

Referring to FIGS. 1–3, there is shown a sealed lever toggle switch including a conductive elastomer coating over the lever seal for RFI elimination constructed in accordance with the invention. As shown therein, the switch is provided with an insulating base 2 to which is attached a metal housing 4 having a threaded bushing 6 extending up therefrom for pivotally supporting a toggle lever 8. A plurality of terminals 10 extend down through the bottom of the base and are connected to stationary contacts within the switch compartment within the base. The switch mechanism within the housing is similar to that shown in H. W. Hults U.S. Pat. No. 3,041,430, dated June 26, 1962, assigned to the assignee of this invention.

The toggle lever is supported in the bushing by a pivot pin 12. As shown in FIGS. 2 and 3, the pivot pin extends through holes in opposite sides of the round bushing and through a hole in the enlarged spherical portion 8a of toggle lever 8. The two outer surfaces of the bushing around these holes are provided with recesses 6a and 6b so that when the pivot pin is riveted therein, it will clear the internal threads of a nut (not shown) that is turned onto outer threads 6c of the bushing in mounting the switch in a hole in a grounded panel 13 as shown in FIG. 1.

A resilient lever seal 14 is molded in situ after the parts have been assembled. This seal is entirely within the bushing and closes the opening in the bushing around the toggle lever and pivot pin while allowing freedom of pivotal movement of the toggle lever. This lever seal is composed of an elastomer such as silicone rubber or the like. This seal is molded in place between bushing 6 and toggle lever 8 around pivot pin 12 so as to surround spherical portion 8a of the lever and part of the shank of the toggle lever above and below it. This seal is substantially circular or cylindrical and has an axial opening therethrough. As shown in FIG. 1, this seal has a pair of substantially U-shaped cross-sections through opposite sides thereof in the central plane transverse to pivot pin 12 and extending in opposite directions from this central plane partway toward the opposite ends of the pivot pin to points short of the pivot pin wherein the seal surrounds and covers the pivot pin as shown in FIGS. 2 and 3. This seal cross-section, on each side as shown in FIG. 1, has an outer depending leg portion having an outer peripheral surface sealed to the upper inner surface within bushing 6, and a longer inner leg portion having an inner substantially cylindrical surface sealed to the toggle lever with a space between the two leg portions to afford freedom of movement. The lower end of the outer leg portion of this seal is confined against a shoulder 6d formed by a single step of increased inside diameter near the top of the bushing, and the inner leg portion is sealed to the toggle lever around the enlarged spherical portion thereof. With this construction of seal, it will be seen that the spaces 14a and 14b shown in FIG. 1 between the inner and outer leg portions of the seal at opposite sides thereof provide clearance for pivotal movement of the toggle lever thereby reducing the force required to actuate the switch. As seen by reference to FIGS. 2 and 3, the spaces between the outer short leg portions and the inner long leg portions of the seal do not extend all the way around the bushing but are filled up at the portions of the seal where the pivot pin passes through so as to seal the opening in the bushing through which the pivot pin passes.

A conductive elastomeric coating 16 is applied to the top of the seal and a similar coating 18 is applied to the bottom of the seal so as to electrically connect the toggle lever to the bushing and thus avoid RFI radiation from the toggle lever. It will be apparent that when the seal is molded in situ, this seal material has a tendency to flow partly into the small space around the pivot pin in the hole in the toggle lever enlarged portion 8a and might insulate the toggle lever from the pivot pin and bushing. For this reason, conductive coatings 16 and 18 are applied so that they cover the seal surfaces and also extend slightly up and down, respectively, along the upper and lower surfaces of the bushing and toggle lever to make good electrical contact therewith. In this way, the toggle lever is assured of being grounded through the bushing and switch housing to the mounting panel. While the conductive coatings have been shown as applied to both the top and bottom of the seal, it will be apparent that only one or the other could be used.

Since silicone elastomer is made conductive through the addition of a conductive medium or material thereto, as for example, in the form of fine conductive particles, interspersed therethrough, such addition has a tendency to reduce the elasticity of the elastomer. Therefore, if the entire seal is made of conductive elastomer as in the aforementioned H. W. Hults copending application, the reduced elasticity will require a greater operating force to be applied to the toggle lever. Such reduced elasticity becomes more critical when operation at low temperatures is involved. This might reduce the life of the seal since reduced elasticity will cause tearing of the seal earlier in its operating life with the possibility of a resultant loss of sealing of the switch. This possible problem is overcome by using a non-conductive silicone elastomer seal with its good elasticity and covering or coating it with electrically conductive elastomer. This layer of conductive elastomer being thin will not add significant stiffness to the seal thereby retaining the freedom of pivotal movement of the toggle lever.

This thin conductive layer may be applied to one or more surfaces of the non-conductive silicon elastomer lever seal by a number of methods after the seal has been molded in place. For example, a conductive elastomer film or layer may be bonded to the non-conductive seal by any of the well-known bonding methods. Alternatively, a conductive elastomer coating may be applied to the non-conductive seal by dipping, brushing, spraying or molding. Or conductive ink or paint may be applied to the seal surface or surfaces by dipping, spraying or brushing.

In this manner, only a very thin coating portion of the seal is electrically conductive while the greater portion of the seal is non-conductive elastomer thereby retaining the greater elasticity of the seal for unimpeded operation of the switch while the thin conductive coating will ground the toggle lever and will stretch the required amount without significant counteracting force to movement of the toggle lever. Thus, the elasticity and long life are retained while at the same time eliminating any RFI problems.

While the apparatus hereinbefore described is effectively adapted to fulfill the objects stated, it is to be understood that the invention is not intended to be confined to the particular preferred embodiment of conductive coating on switch lever seal for RFI elimination disclosed, inasmuch as it is susceptible of various modifications without departing from the scope of the appended claims.

I claim:
1. An electric switch comprising:
   a switch housing at least partly of metal having an opening therein and normally being grounded in use;
   a metal switch actuator extending out through said opening so as to be accessible for operation to actuate the switch;
   means mounting said metal switch actuator in said opening;
   a resilient seal within said opening closing the space around said metal switch actuator to seal the interior of said switch housing from the outside and being flexible to afford relatively unimpeded movement of said metal switch actuator, said seal having first and second surfaces in sealing engagement with said actuator and said housing, respectively, and third and fourth surfaces exposed to the inside of said housing and to the outside, respectively;
   and a conductive elastomeric coating on and covering at least one of said exposed surfaces of said seal and adhering thereto electrically groundng said metal switch actuator through said housing to avoid RFI radiation therefrom.
2. The electric switch claimed in claim 1, wherein:
   said conductive elastomeric coating comprises a thin layer of electrically conductive elastomer adhering to the outer surface of said seal.
3. The electric switch claimed in claim 1, wherein:
   said conductive elastomeric coating comprises a thin coating of elastomer having electrically conductive material interspersed therethrough.
4. The electric switch claimed in claim 1, wherein:
   said conductive elastomeric coating comprises a thin film of conductive rubber bonded to said seal and extending partway along said actuator and said opening of said housing and in electrical connection therewith.
5. An electric toggle switch comprising:
   a switch housing containing switch means and having a metal bushing extending therefrom with an aperture through said bushing;
   a metal toggle lever mounted to said bushing and extending out through said aperture so as to be accessible for pivotal operation to actuate said switch means;
   a resilient seal within said bushing aperture and closing the opening around said toggle lever while allowing freedom of pivotal movement of said toggle lever, said seal having first and second portions in sealing engagement with said metal toggle lever and said housing, respectively, and first and second surfaces exposed to the inside of said bushing and to the outside thereof, respectively;
   and an electrically conductive elastomeric coating covering at least one of said surfaces of said resilient seal and part of said toggle lever and part of said bushing within said aperture to electrically ground said toggle lever through said metal bushing to the switch mounting panel to prevent RFI radiation therefrom.
6. The electric toggle switch claimed in claim 5, wherein:
   said resilient seal comprises non-conductive elastomer;
   and said electrically conductive elastomeric coating comprises elastomer material having electrically conductive material interspersed therethrough.
7. The electric toggle switch claimed in claim 5, wherein:
   said resilient seal comprises non-conductive elastomer material;
   and said electrically conductive elastomeric coating comprises a mixture of elastomer material and electrically conductive particles interspersed therethrough applied to adhere to both of said surfaces of said seal so as to electrically bridge said toggle lever to said bushing.

* * * * *